United States Patent
Lian et al.

(10) Patent No.: US 7,056,819 B2
(45) Date of Patent: Jun. 6, 2006

(54) METHODS AND APPARATUS FOR DETERMINING PAD HEIGHT FOR A WIRE-BONDING OPERATION IN AN INTEGRATED CIRCUIT

(75) Inventors: Sean Lian, Allentown, Lehigh County, PA (US); Vivian Ryan, Hampton, Warren County, NJ (US); Debra Louise Yencho, Allentown, Lehigh County, PA (US)

(73) Assignee: Agere Systems Inc., Allentown, PA (US)

( * ) Notice: Subject to any disclaimer, the term of this patent is extended or adjusted under 35 U.S.C. 154(b) by 114 days.

(21) Appl. No.: 10/673,703

(22) Filed: Sep. 29, 2003

(65) Prior Publication Data

US 2005/0067678 A1   Mar. 31, 2005

(51) Int. Cl.
*H01L 21/44* (2006.01)

(52) U.S. Cl. .................. 438/617; 438/15

(58) Field of Classification Search .............. None
See application file for complete search history.

(56) References Cited

U.S. PATENT DOCUMENTS

| | | | | |
|---|---|---|---|---|
| 5,037,023 A | * | 8/1991 | Akiyama et al. | 228/102 |
| 6,080,651 A | * | 6/2000 | Takahashi et al. | 438/617 |
| 6,405,357 B1 | * | 6/2002 | Chao et al. | 716/10 |

* cited by examiner

*Primary Examiner*—Leonardo Andujar

(57) ABSTRACT

Methods and apparatus for performing a wire-bonding operation in an integrated circuit are disclosed. The positions of at least one height-sensing pad and at least one bond pad are determined on a top surface of an integrated circuit die. The height-sensing pad is electrically isolated from the die circuitry and the bond pad is electrically connected to the die circuitry. A bonding tool is lowered to the height-sensing pad, and a height coordinate of the height-sensing pad is then determined. Finally, the bond pad is wire-bonded to a leadframe utilizing the height coordinate of the height-sensing pad.

19 Claims, 4 Drawing Sheets

METHODS AND APPARATUS FOR DETERMINING PAD HEIGHT FOR A WIRE-BONDING OPERATION IN AN INTEGRATED CIRCUIT

FIELD OF THE INVENTION

The present invention is related to methods and apparatus for performing a wire-bonding operation on an integrated circuit during packaging and, more particularly, for determining appropriate pad height coordinates without causing damage to the pads during the wire-bonding operation.

BACKGROUND OF THE INVENTION

An integrated circuit is typically fabricated on a single chip of silicon or other semiconductor material, also referred to as a die, which is then packaged for use. During packaging, the integrated circuit die is wire-bonded to leads of a leadframe. A robotic bonding tool may be used in this operation. Such a tool generally includes a surface/wire-feed detection system that detects bond pads of the integrated circuit die, determines the height coordinates of the bond pads, and wire-bonds the bond pads to the leadframe. After detecting the location of bond pads on the surface of the die, the bonding tool is lowered to a starting bond pad to determine the height coordinate of the pad and to adjust ultrasonic power without bonding. This first "learning touch" is performed without knowledge as to the accuracy of the height coordinate. As a result the bonding tool frequently overestimates the height coordinate and the tip of the bonding tool, also referred to as a capillary/wedge, forcefully contacts the starting bond pad. This forceful contact may cause significant damage to the bond pad, the underlying dielectric films, and the die, resulting in bonding difficulties in the integrated circuit.

Further, since the die is rarely staged precisely flat for a bonding operation, the bonding tool may determine the tilt of the integrated circuit die. This is traditionally accomplished by determining the height coordinates of selected bond pads at opposing locations on the die. The measured height coordinates of these bond pads are then used by the robotic bonding tool to interpolate the height of the remaining bond pads, such that bonding may be performed at the correct height coordinate for each bond pad. However, the selected pads may be damaged in the same manner as the starting bond pad as described above.

Several attempts have been made to solve the problem of the potentially damaging "learning touch" of the bonding tool. First, it has been proposed to more precisely measure setup procedures, so that the "learning touch" is manually executed for each individual die. However, this may result in decreased manufacturing speeds, as well as additional difficulties in the case of a die which includes mechanically-weak low-k dielectric films under its bond pads. It has also been proposed to retrofit bonding tools with atomic force microscopy hardware, however, such hardware add-ons are very expensive. The problem may also be ignored, relying on the likelihood that any failures will be caught during burn-in testing. However, there is not always an early electrically-detectable signal indicating that damage has been done during bonding. Instead, the realization may come when the device has been operating in the field for months or years, undesirably affecting device reliability.

Thus, a need exists for a method and apparatus for determining bond pad height coordinates in an integrated circuit without causing damage to the pads, dielectric films, or die, and without the other drawbacks of the conventional techniques.

SUMMARY OF THE INVENTION

The present invention in accordance with one aspect thereof provides at least one extra pad, referred to herein as a height-sensing pad, on an integrated circuit die. In the illustrative embodiment, the present invention provides methods and apparatus for wire-bonding an integrated circuit during packaging. More particularly, the present invention provides methods and apparatus for determining appropriate pad height coordinates without causing damage to bond pads during the wire-bonding process.

One aspect of the invention is a method for performing a wire-bonding operation in an integrated circuit, comprising the following steps. The positions of at least one height-sensing pad and at least one bond pad on a surface of an integrated circuit die are determined, where the height-sensing pad is electrically isolated from the die circuitry and the bond pad is electrically connected to the die circuitry. A bonding tool is then lowered to the height-sensing pad, and a height coordinate of the height-sensing pad is determined. Finally, the bond pad is wire-bonded to a lead of a leadframe utilizing the height coordinate of the height-sensing pad.

An additional aspect of the invention relates to compensating for tilt of the integrated circuit die in the bonding tool. Height-sensing pads may be disposed on the surface of the integrated circuit die. The bonding tool may be lowered to each height-sensing pad in order to obtain height coordinates for each pad and thus the plane of the integrated circuit die. The bonding tool is then able to determine the tilt of the integrated circuit die in relation to the bonding tool. This tilt measurement is used in determining the position and height coordinates of the bond pads of the integrated circuit.

Further, the height-sensing pads may be in close proximity to bond pads but more distant from active circuitry than the bond pads.

Advantageously, the present invention eliminates yield loss caused by pad damage without any additional hardware and is easy to implement with any integrated circuit technology. Further, the height-sensing pads may be placed anywhere on the surface of the die. Determining the tilt of an integrated circuit die in a bonding tool is especially useful for a larger die.

These and other objects, features, and advantages of the present invention will become apparent from the following detailed description of illustrative embodiments thereof, which is to be read in connection with the accompanying drawings.

DETAILED DESCRIPTION OF THE PREFERRED EMBODIMENTS

As will be illustrated in detail below, the present invention in an illustrative embodiment provides at least one height-sensing pad, and at least one bond pad on an integrated circuit die. Positions of height-sensing pads and bond pads on the surface of the integrated circuit die are first determined. A bonding tool is lowered to the height-sensing pad to establish a height coordinate for the height-sensing pad, which is then used in determining height coordinates of bond pads. Any damage to the height-sensing pad is inconsequential since the pad is physically separated from active die circuitry.

Figure 1:
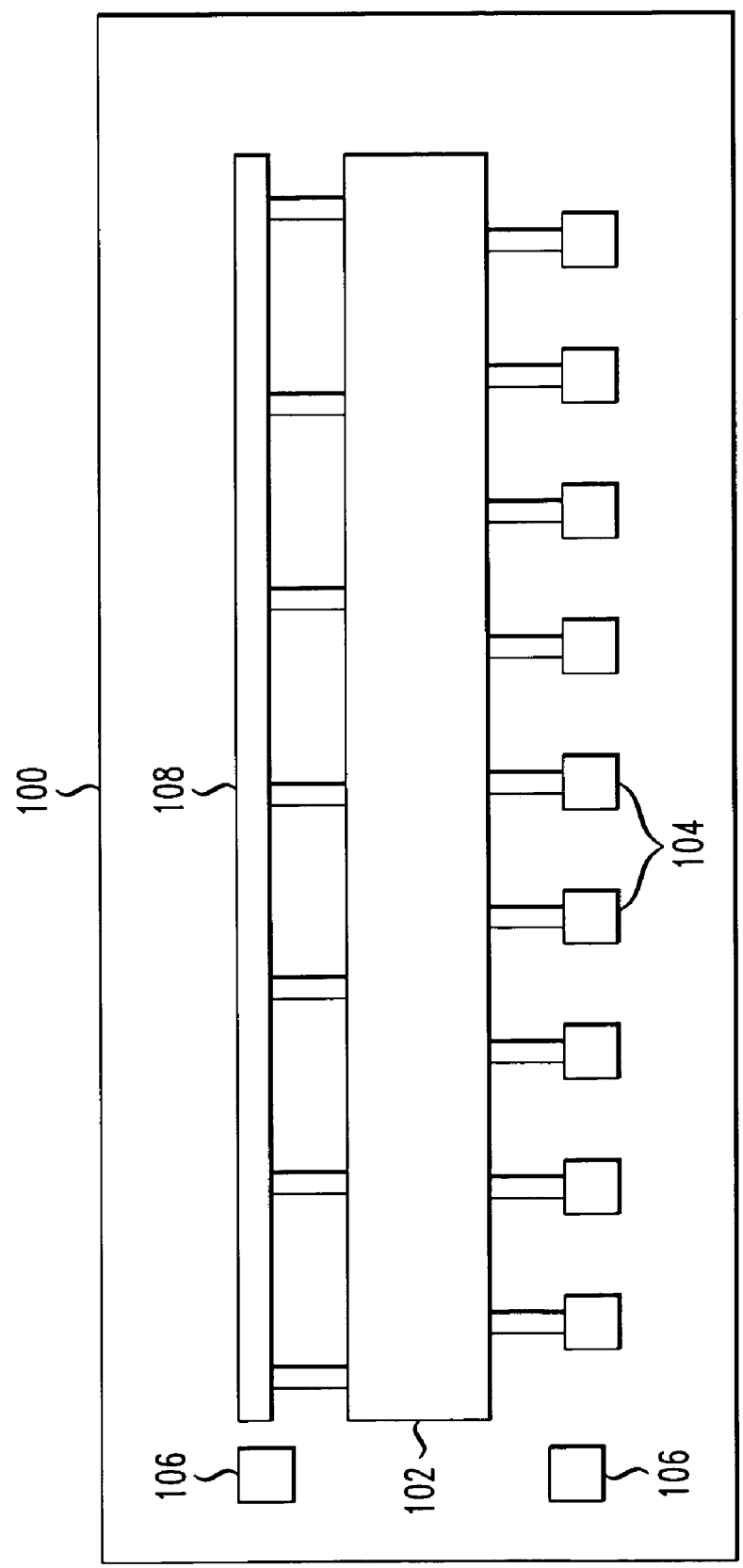
FIG. 1 is a diagram illustrating a die having height-sensing pads, according to an embodiment of the present invention.

Referring initially to FIG. 1, a diagram illustrates a die having height-sensing pads, in accordance with an embodiment of the present invention. A die 100 comprises die circuitry 102 electrically connected to bond pads 104. Bond pads 104 surround die circuitry 102 and are used to electrically connect, preferably through wire-bonding, die circuitry 102 to leads of a leadframe (not shown). Bond pads 104 are wire-bonded to the leads of the leadframe with a bonding tool.

Height-sensing pads 106 are also disposed on die 100 and are fashioned in substantially the same manner as bond pads 104. For example, height-sensing pads 106 may be the same shape, size and configuration as bond pads 104. Height-sensing pads 106 may be disposed anywhere on the surface of die 100, but remain electrically isolated from die circuitry 102. Although not shown as such in FIG. 1, height-sensing pads 106 are preferably more distant from die circuitry 102 than bond pads 104. Further, the number and placement of height-sensing pads 106 may vary depending on their desired use.

Finally, a bond rail 108 may also be disposed on die 100. Bond rail 108 provides a strip of potential bonding area, electrically connected to die circuitry 102, in place of multiple individual bond pads 104. Bbond rail 108 may be disposed on both sides of die circuitry 102; multiple bond pads 104 may be disposed on both sides of die circuitry 102; or any combination of bond rails 108 and bond pads 104 may be configured. In the embodiment shown in FIG. 1, height-sensing pads 106 are disposed adjacent to a row of bond pads 104 on one side of die circuitry 102 and adjacent to bond rail 108 on the other side of die circuitry 102.

Figure 2:
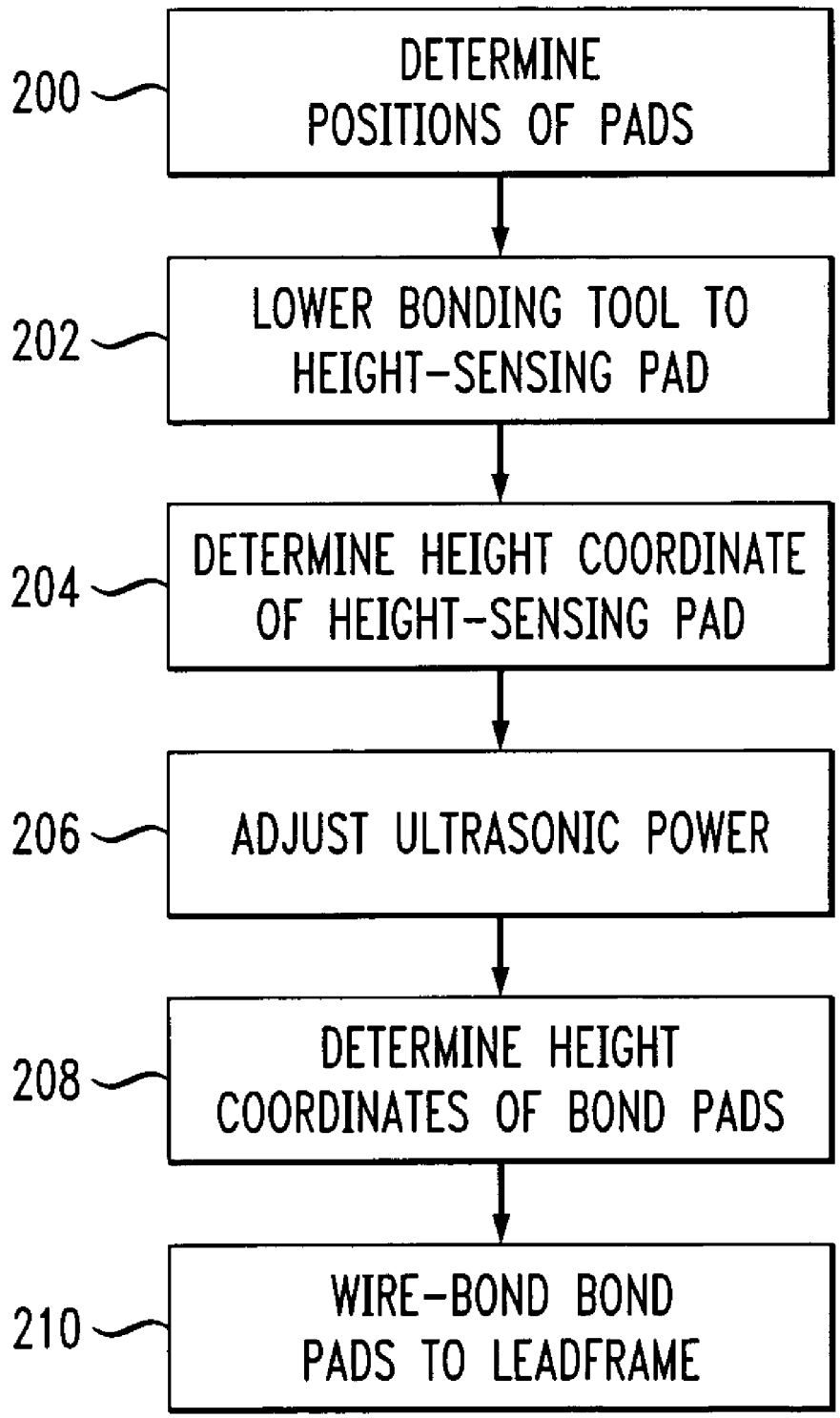
FIG. 2 is a flow diagram illustrating a bonding methodology using height-sensing pads, according to an embodiment of the present invention.

Referring now to FIG. 2, a flow diagram illustrates a bonding methodology using height-sensing pads, according to an embodiment of the present invention. A bonding tool is preferably used in performing the wire-bonding of die circuitry 102 of FIG. 1 to leads of a leadframe. In step 200, the positions of bond pads 104 and height-sensing pads 106 on the surface of die 100 are determined. The term "position" in this context is intended to include, by way of example and without limitation, a two-dimensional location on the top surface of the die. An existing surface/wire-feed detection system bonding tool may scan the surface of die 100 to determine the positions of bond pads 104 and height-sensing pads 106 when die 100 is in place in the bonding tool. Positions of bond pads 104 and height-sensing pads 106 on the surface of die 100 may also be manually input into the bonding tool. However, the precise height coordinates of bond pads 104 and height-sensing pads 106 within the bonding tool remain unknown.

A height coordinate defines the distance the bonding tool must descend in order to reach a bond pad 104 and perform wire-bonding. If the bonding tool descends too far, it may damage bond pad 104, the underlying dielectric film, and die 100. If the bonding tool does not descend far enough, the bonding cannot be performed. In bonding errors, the bonding tool typically descends too far rather than not far enough. In order to determine the correct height coordinate without causing damage, the bonding tool is lowered to a height-sensing pad 106 in step 202. Lowering the bonding tool too far in this case is not a concern since damage to height-sensing pad 106 does not affect the operation of the integrated circuit. This is due to the fact that height-sensing pad 106 is not electrically connected to die circuitry 102 as well as the fact that height-sensing pad 106 is preferably more distant from die circuitry 102 than bond pads 104. Once the bonding tool is lowered to height-sensing pad 106, the height coordinate is determined in step 204. The ultrasonic power of the bonding tool may then be adjusted in step 206 based on this height coordinate.

The height coordinate determined for height-sensing pad 106 is then utilized in determining the height coordinates of one or more bond pads 104 in step 208. The number of bond pads 104 that have height coordinates determined from the height coordinate of a single height-sensing pad 106 depends on the number of height-sensing pads 106 to be utilized with die 100 and their position on the surface of die 100. Preferably, height-sensing pads 106 are positioned before a starting bond pad 104 and after a final bond pad 104. This provides the bonding tool with height coordinates at the beginning and end of the wire-bonding process. These height coordinates then assist in determining the proper height coordinates of each bond pad on die 100. Height-sensing pads 106 may also be arranged so that a single height-sensing pad 106 may be utilized for each bond pad 104. In such a case, a height-sensing pad 106 would be disposed adjacent to each bond pad 104, but more distant from die circuitry 102, so that the closest height coordinate can be determined. After determining the height coordinates of the bond pads 104 of die 100, the bonding tool wire-bonds bond pads 104 to leads of a leadframe in step 210.

Figure 3:
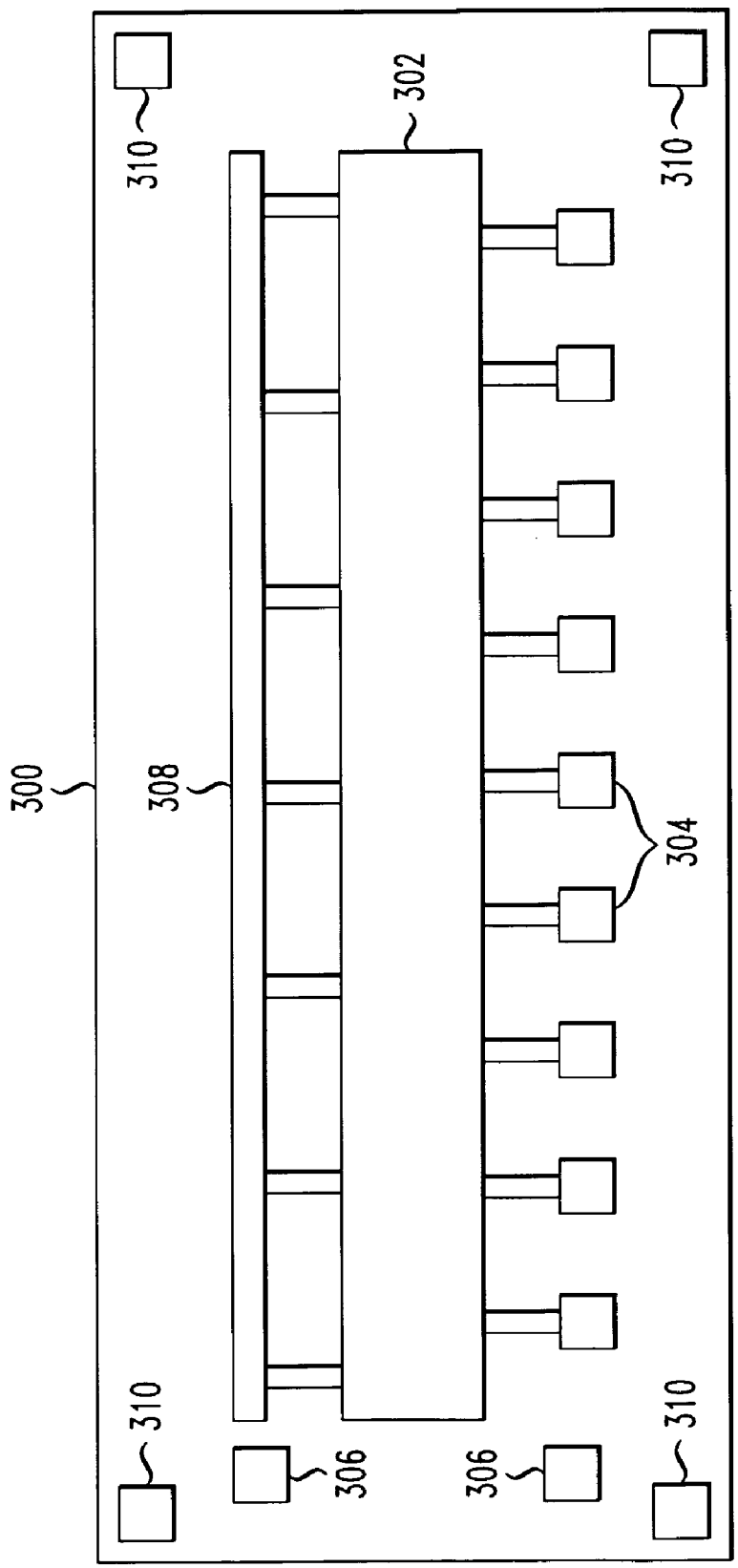
FIG. 3 is a diagram illustrating a die having height-sensing pads positioned for determining tilt, according to an embodiment of the present invention.

Referring now to FIG. 3, a diagram illustrates a die having height-sensing pads positioned for determining tilt, according to an embodiment of the present invention. A die 300 comprises die circuitry 302 electrically connected to bond pads 304. Height-sensing pads 306 are also disposed on die 300 and are fashioned in substantially the same manner as bond pads 304. Height-sensing pads 306 may be disposed anywhere on the surface of die 300, but remain electrically isolated from die circuitry 302 and preferably more distant from die circuitry 302 than bond pads 304. Further, the number of height-sensing pads 306 may vary depending on their desired use. A bond rail 308 may also be electrically connected to die circuitry 302. Similar to the embodiment in FIG. 1, any combination of bond rails 308 and bond pads 304 may be used to surround die circuitry 302.

Additional height-sensing pads 310 are disposed on die 300 in order to determine the plane of die 300 and the tilt of die 300 with respect to the bonding tool. Additional height-sensing pads 310 are fashioned in substantially the same manner as bond pads 304 and height-sensing pads 306. For example, additional height-sensing pads 310 may be the same shape, size and configuration as bond pads 304 and height-sensing pads 306. There are preferably at least three additional height-sensing pads 310 allowing the bonding tool to measure at least three height coordinates so that a plane having the three height coordinates may be determined. This plane determines the tilt of die 300 in the bonding tool. FIG. 3 shows four additional height-sensing pads 310. Each additional height-sensing pad 310 is disposed in a corner of die 300. As the number of additional height-sensing pads 310 provided on the surface of die 300 increases, the accuracy of the measurement of the plane of die 300 increases. Further, when a tilt of a die is introduced into the calculation of bond pad 304 height coordinates, the accuracy of these height coordinates increases.

While the present embodiment distinguishes height-sensing pads 306 and additional height-sensing pads 310 in order to clarify their different purposes, a single height-sensing pad 306 or additional height-sensing pad 310 may be used for multiple purposes. For example, a height coordinate of a single height-sensing pad 306 may be used in determining a height coordinate of at least one bond pad 304, and as one of many height coordinates for determining the plane of die 300 and the tilt of die 300 within the bonding tool.

Figure 4:
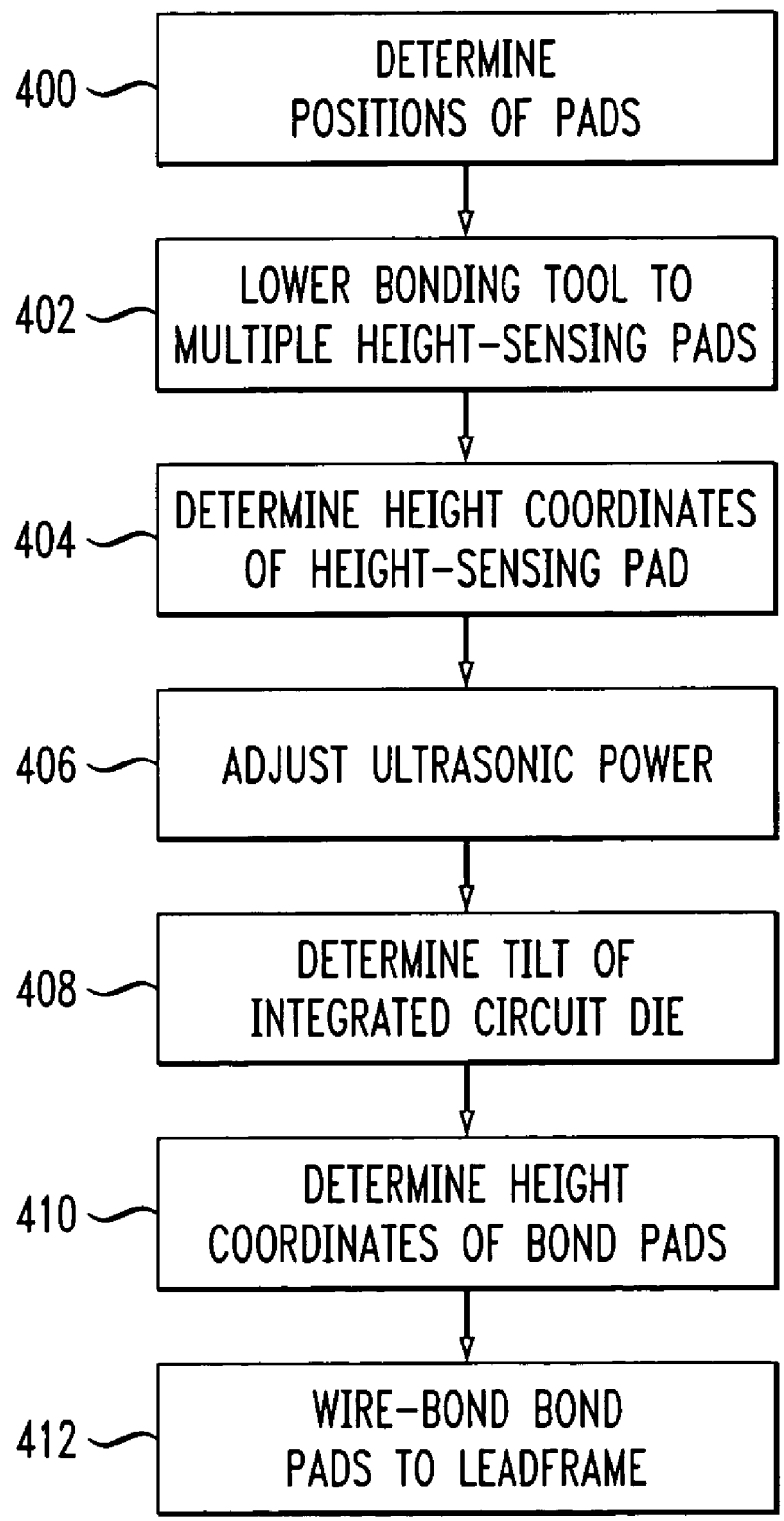
FIG. 4 is a flow diagram illustrating a tilt determination and bonding methodology using height-sensing pads, according to an embodiment of the present invention.

FIG. 4 shows a flow diagram illustrating a tilt determination and bonding methodology using height-sensing pads according to an embodiment of the present invention. The positions of bond pads 304, height-sensing pads 306, and additional height-sensing pads 310 are first determined in step 400. The positions of these pads may be determined through the scanning of die 300 by the bonding tool, or through the manual inputting of positions into the bonding tool. The bonding tool is then lowered to height-sensing pads 306 and additional height-sensing pads 310 in step 402. The height coordinates of height-sensing pads 306 and additional height-sensing pads 310 are determined in step 404. The ultrasonic power is then adjusted in step 406 based on the height coordinates. The height coordinates of additional height-sensing pads 310 help to determine the plane of die 300 in the bonding tool.

In step 408, the tilt of die 300 is determined, with respect to the bonding tool, utilizing the height coordinates of additional height-sensing pads 310 and the resulting plane. With the height coordinates of both the height-sensing pads 306 and additional height-sensing pads 310 the bonding tool is able to more accurately determine the height coordinates of bond pads 304 in step 410. Bond pads 304 are then wire-bonded to leads of a leadframe in step 412. The number and position of height-sensing pads 306 and additional height-sensing pads 310 may vary as discussed above.

Accordingly, as described herein, the present invention determines appropriate pad height coordinates without causing damage to bond pads during the wire-bonding process. Further, the present invention more accurately determines the pad height by first taking measurements of electrically-isolated pads disposed on the same die surface. Finally, the present invention increases the accuracy of the measurement when determining height coordinates of multiple bond pads by determining the tilt of the die in the bonding tool.

Although illustrative embodiments of the present invention have been described herein with reference to the accompanying drawings, it is to be understood that the invention is not limited to those precise embodiments, and that various other changes and modification may be made by one skilled in the art without departing from the scope or spirit of the invention.

What is claimed is:

1. A method for performing a wire-bonding operation in an integrated circuit, comprising the following steps:
   determining positions of at least one height-sensing pad and at least one bond pad on a top surface of an integrated circuit die, wherein the at least one height-sensing pad is electrically isolated from circuitry of the die and the at least one bond pad is electrically connected to the die circuitry;
   lowering a bonding tool to the at least one height-sensing pad;
   determining a height coordinate of the at least one height-sensing pad; and
   wire-bonding the at least one bond pad to a lead of a leadframe utilizing the height coordinate of the at least one height-sensing pad.

2. The method of claim 1, further comprising the step of determining a height coordinate of the at least one bond pad.

3. The method of claim 2, wherein the height coordinate of the at least one height-sensing pad is used in determining the height coordinate of the at least one bond pad.

4. The method of claim 1, further comprising the step of adjusting ultrasonic power of the bonding tool after the height coordinate of the at least one height-sensing pad is determined.

5. The method of claim 1, wherein in the step of lowering a bonding tool comprises the step of lowering the bonding tool to a height-sensing pad adjacent to a starting bond pad, wherein the starting bond pad is the first bond pad, in a given set of bond pads of the die, to be bonded to a lead of the leadframe.

6. The method of claim 1, wherein the step of lowering a bonding tool comprises the step of lowering the bonding tool to a height-sensing pad adjacent to a terminating bond pad, wherein the terminating bond pad is the last bond pad, in a given set of bond pads of the die, to be bonded to a lead of the leadframe.

7. The method of claim 1, wherein the at least one bond pad comprises a bond rail.

8. The method of claim 7, wherein the height-sensing pad is arranged adjacent to the bond rail.

9. The method of claim 1, wherein the at least one bond pad comprises a bond rail and a plurality of bond pads.

10. The method of claim 1, wherein the step of determining positions of at least one height-sensing pad and at least one bond pad comprises the step of scanning the top surface of the die.

11. The method of claim 10, wherein, in the step of scanning the top surface of the die, a surface/wire-feed detection system is used.

12. The method of claim 1, wherein the step of determining positions of at least one height-sensing pad and at least one bond pad comprises the step of manually programming the bonding tool with the positions of at least one height-sensing pad and at least one bond pad on the top surface of the die.

13. The method of claim 1, wherein the top surface of the integrated circuit die includes a plurality of height-sensing pads, each corresponding to one of a plurality of bond pads.

14. The method of claim 1, wherein the at least one height-sensing pad is disposed further from the die circuitry than the at least one bond pad.

15. The method of claim 1, wherein a height-sensing pad is disposed at each corner of the integrated circuit die.

16. The method of claim 1, wherein at least three height-sensing pads are disposed on the top surface of the integrated circuit die.

17. The method of claim 16, further comprising the step of determining a plane of the integrated circuit die from the height coordinates obtained from the at least three height-sensing pads.

18. The method of claim 17, further comprising the step of determining a tilt of the integrated circuit die with respect to the bonding tool using the plane of the integrated circuit die.

19. The method of claim 18, further comprising the step of determining the height coordinate of the at least one bond pad using the height coordinate of the at least one height-sensing pad and the tilt of the integrated circuit die.

* * * * *